(12) United States Patent
Miyanishi et al.

(10) Patent No.: US 6,269,280 B1
(45) Date of Patent: Jul. 31, 2001

(54) SEMICONDUCTOR DEVICE AND METHOD OF FABRICATING THE SAME

(75) Inventors: Atsushi Miyanishi; Akira Yamazaki, both of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/113,029

(22) Filed: Jul. 13, 1998

(30) Foreign Application Priority Data

Jan. 19, 1998 (JP) .................................................. 10-007830

(51) Int. Cl.$^7$ ...................................................... G06F 17/50
(52) U.S. Cl. ............................................. 700/121; 716/14
(58) Field of Search .............................. 700/121; 710/42; 714/718; 716/14

(56) References Cited

U.S. PATENT DOCUMENTS

| 5,787,310 | 7/1998 | Shimizu et al. ...................... 710/42 |
| 5,889,726 | * 3/1999 | Jeddeloh ............................. 365/233 |
| 5,910,181 | 6/1999 | Hatakenaka et al. ................ 714/718 |
| 5,923,570 | * 7/1999 | Shigemoto ..................... 395/500.09 |
| 5,926,397 | * 7/1999 | Yamanouchi ......................... 716/14 |
| 5,930,182 | * 7/1999 | Lee ..................................... 365/194 |
| 6,034,548 | * 3/2000 | Churcher et al. ...................... 326/49 |
| 6,044,024 | * 3/2000 | Barth et al. .................... 365/189.08 |
| 6,094,736 | * 7/2000 | Komoike ............................. 714/726 |

FOREIGN PATENT DOCUMENTS

| 60-187037 | 9/1985 | (JP) . |
| 4-246857 | 9/1992 | (JP) . |
| 5-48055 | 2/1993 | (JP) . |
| 6-69339 | 3/1994 | (JP) . |
| 409246391A | * 9/1997 | (JP) ............................. G06F/17/50 |

* cited by examiner

*Primary Examiner*—Thomas Lee
*Assistant Examiner*—Abdelmoniem Elamin
(74) *Attorney, Agent, or Firm*—Burns, Doane, Swecker & Mathis, LLP

(57) ABSTRACT

A DRAM control circuit or a test circuit describing a delay control cell is prepared. Automatic placement and routing is performed in relation to this circuit. Circuit simulation is executed at a step ST16. Delay control is performed with the delay control cell on the basis of a simulation result. Alternatively, delay control is performed with a circuit of the delay control cell on the basis of a test result. Thus, automatic placement and routing of at least either the DRAM control circuit or the test circuit provided in a DRAM is enabled.

17 Claims, 18 Drawing Sheets

SEMICONDUCTOR DEVICE AND METHOD OF FABRICATING THE SAME

BACKGROUND OF THE INVENTION

1. Field of the Invention

The present invention relates to a semiconductor device and a method of fabricating the same, and more particularly, it relates to a semiconductor device comprising a logic integrated circuit (hereinafter referred to as a logic) and a dynamic random access memory (hereinafter referred to as a DRAM) which are mounted on a single chip. Throughout this specification, it is assumed that the concept of the logic includes a central processing unit (hereinafter referred to as a CPU).

2. Description of the Background Art

FIG. 19 is a conceptual diagram showing an exemplary structure of a semiconductor device comprising a DRAM and a logic which are formed on a plurality of chips 1 and 2. Signal lines 3 connect the chips 1 and 2 provided with the DRAM and the logic respectively with each other. Since a fabrication method suitable for improving the performance of the DRAM is different from that suitable for improving the performance of the logic, it is common to form the DRAM and the logic on the different chips 1 and 2, which in turn are connected with each other by the signal lines 3 as shown in FIG. 19.

In case of exchanging data processed by the chips 1 and 2 provided with the DRAM and the logic through the signal lines 3, however, the processing speed of the semiconductor device is limited. In order to solve this problem, a DRAM 5 and a logic 6 can be provided on a single chip 4 as shown in FIG. 20, for improving the speed of the semiconductor device. A semiconductor device such as that shown in FIG. 20 is hereinafter referred to as an embedded RAM, which is abbreviated as eRAM. The DRAM 5 provided in the eRAM is different in tendency of production, countermeasures for improving productivity and tendency of specifications from the DRAM mounted on the single chip 1. Table 1 shows such differences.

TABLE 1

|  | In Case of Implementing DRAM with Single Chip | In Case of Embedding DRAM in eRAM |
| --- | --- | --- |
| Tendency of Production | Small Variety/ Mass Production | Large Variety/ Small-Lot Production |
| Countermeasures for Improving Productivity | Improvement of Yield/Miniaturization | Reduction of Term of Works in Addition to Improvement of Yield |
| Tendency of Specification | Standardization | Partial Discrimination |

However, the design of an eRAM is often changed in the process of fabricating the product, due to partial discrimination of specifications for each customer. Such eRAMs are generally produced in a small lot in response to the order of the customer. Further, eRAMs are developed in a large variety as compared with DRAMs which are formed on single chips. The DRAMs formed on single chips are mass-produced, and hence improvement of productivity is achieved by miniaturization. In order to improve the productivity of the eRAMs which are produced in response to the order of the customer, on the other hand, it is an important subject to reduce the time required to design and layout the circuit, also referred to as the term of works. Such reduction of the term of works is implemented by computerizing noncomputerized design or reducing the time for computer aided design.

FIG. 21 is a flow chart showing fabrication steps for an eRAM from decision of specifications to mass production. Referring to FIG. 21, steps ST1, ST2, ST3, ST4, ST5 and ST6 are adapted to decide the specifications, to design architecture in response to the decided specifications, to design the logic and the circuit on the basis of the designed architecture, to design the layout on the basis of circuit connection information created at the step ST3, to prepare a mask on the basis of a layout diagram created at the step ST4 for subsequently performing manufacture, and to test and evaluate some test pieces obtained at the step ST5 respectively. When a predetermined number of the test pieces satisfy the specifications in the test and evaluation step ST6, a step ST7 for production is carried out. If the predetermined number of the test pieces do not satisfy the specifications at the step ST6, the process returns to the step ST3 for designing the logic and/or the circuit again, for example.

FIG. 22 is a flow chart showing exemplary contents of the step ST4 shown in FIG. 21. FIG. 23 is a block diagram showing an exemplary structure of the eRAM produced through the fabrication steps shown in FIG. 21. First, blocks forming the eRAM are classified into those allowing automatic placement and routing and those allowing no automatic placement and routing respectively at a step ST10. As to the blocks allowing automatic placement and routing, functional blocks and standard cells are automatically arranged at a step ST12. Intra-block automatic routing is performed at a step ST13. Automatic placement and automatic routing are performed for interconnecting the blocks completing inter-block automatic routing at a step ST14. A computer extracts resistances and capacitances of the interconnection lines from a layout diagram thus formed (step ST15). Circuit simulation is performed at a step ST16, with addition of information of the extracted resistances and capacitances.

As to the blocks allowing no automatic placement and routing, a designer designs the layout while interacting with a layout editor (step ST11). The designer connects parts manually routed at the step ST11 with those automatically placed and routed through the steps ST12 to ST14, with the layout editor. The designer checks design rules at a step ST18. If a result of this check satisfies the specifications, the designer ascertains the layout diagram. If the specifications are not satisfied, the process returns to a proper step in response to the situations, for design the layout again.

Referring to FIG. 23, parts shaded with slant lines show parts allowing no automatic placement and routing, while parts of the eRAM, i.e., a CPU 120 and interconnection lines connecting the CPU 120 with banks #A to #D of a DRAM allow automatic placement and routing. In the CPU 120 consisting of a plurality of blocks, intra-block wiring and inter-block wiring are automatically performed. The parts allowing no automatic placement and routing include DRAM arrays 102a to 102d, row decoders 103a to 103d, column decoders 104a to 104d, preamplifiers/write drivers 105a to 105d, a DRAM control circuit 110, a test circuit 140 etc.

The reason why the DRAM control circuit 110, the test circuit 140 etc. allow no automatic placement and routing is now described with reference to the DRAM control circuit 110. As shown in FIG. 24, the DRAM control circuit 110 includes an internal clock generation circuit 130 for generating various internal clocks clka to clkc from an externally supplied clock EXCLK. FIG. 25 shows exemplary relation between the internal clocks cika to clkc and the external clock EXCLK. The DRAM must complete a series of operations within each clock EXCLK. The internal clocks clka to clkc supply the timing for the complicated series of operations progressing in a time-series manner. The interval between the internal clocks clka to clkc, which are generated by delaying the clock EXCLK, is about several nsec. or shorter. Due to delay control for the internal clocks clka to clkc having such a short interval, it is difficult to automatically arrange/interconnection line the DRAM control circuit 110. This also applies to the test circuit 140 generating other internal clocks.

In particular, it is difficult to set the delay time between first and second times in case of employing automatic placement and routing, although the delay time can be set within a prescribed time in the automatic placement and routing of the background technique. Referring to FIG. 25, the internal clock clka must be generated after a lapse of a time t1 and before a lapse of a time t2, in an exemplary operation of setting the internal clock clka between first and second times.

When automatic placement and routing is employed for designing the layout of the DRAM control circuit 110, increase of the layout area is predicted. It is desirable to suppress such increase of the layout area to the minimum in the eRAM.

Documents related to automatic placement and routing are now introduced. Japanese Patent Laying-Open Gazettes Nos. 6-69339 (1994), 60-187037 (1985), 5-48055 (1993), 4-246857 (1992), 6-216247 (1994) and 2-122527 (1990) disclose inventions related to automatic placement and routing. However, every one of these documents relates to automatic placement and routing of a logic, with no automatic placement and routing in relation to a DRAM. None of these documents describes an eRAM comprising a logic and a DRAM mounted on a single chip.

In the conventional semiconductor device having the aforementioned structure and the method of fabricating the same, no automatic placement and routing can be performed in the DRAM, and hence a long time is required for the design to disadvantageously increase the term of works for fabrication.

When automatic placement and routing is employed for the part of the DRAM, further, it is disadvantageously difficult to miniaturize the semiconductor device.

SUMMARY OF THE INVENTON

According to a first aspect of the present invention, a method of fabricating a semiconductor device comprises the steps of preparing a delay control cell usable in automatic placement and routing having a delay control element which is connected by an interconnection line having connectional relation changeable before completion of a product, describing the delay control cell in a logic circuit diagram related to a prescribed block of a dynamic random access memory concerned in an internal clock, creating a layout diagram from the logic circuit diagram by automatic placement and routing, and forming an integrated circuit on the basis of the layout diagram.

In the method of fabricating a semiconductor device according to the first aspect of the present invention, a delay time for the internal clock can be controlled by changing connection of the delay control element, a prescribed block of a DRAM related to the internal clock can be automatically arranged/interconnection lined and a time required for layout design is reduced, whereby the term of works for fabricating the semiconductor device can be effectively reduced.

According to a second aspect of the present invention, the step of forming the integrated circuit includes the steps of measuring the internal clock, and changing connection of the delay control element on the basis of a measurement result of the internal clock.

In the method of fabricating a semiconductor device according to the second aspect of the present invention, the delay time can be controlled by changing connection of the delay control cell on the basis of a result of actual measurement after formation of the integrated circuit, whereby the number of times for re-designing the layout can be reduced and the term of works for fabricating the semiconductor device can be effectively reduced.

According to a third aspect of the present invention, the step of preparing the delay control cell includes a step of preparing a delay control cell having a switching interconnection line for switching connection of the delay control element in a wiring layer corresponding to an uppermost layer, and the step of changing connection of the delay control element on the basis of a measurement result of the internal clock includes a step of switching connection of the delay control element with the switching interconnection line.

In the method of fabricating a semiconductor device according to the third aspect of the present invention, connection of the delay control cell built in the integrated circuit can be changed by actually switching the switching interconnection line in formation of the integrated circuit, whereby an operation for changing a mask or the like can be omitted and the term of works for fabricating the semiconductor device can be effectively reduced.

According to a fourth aspect of the present invention, the step of creating the layout diagram includes the steps of extracting a resistance and a capacitance from an uncorrected layout diagram which is formed by the automatic placement and routing, performing circuit simulation with the uncorrected layout diagram and information of the resistance and the capacitance, and changing connection of the delay control element in response to a result of the circuit simulation for creating a corrected layout diagram.

In the method of fabricating a semiconductor device according to the fourth aspect of the present invention, the delay time can be controlled by changing connection of the delay control cell on the basis of a result of the circuit simulation and the time required for layout design is reduced by reducing the number of times for re-designing the layout through creation of the corrected layout diagram, whereby the term of works for fabricating the semiconductor device can be effectively reduced.

According to a fifth aspect of the present invention, the step of forming the integrated circuit includes the steps of measuring the internal clock, and changing connection of the delay control element on the basis of a measurement result of the internal clock.

In the method of fabricating a semiconductor device according to the fifth aspect of the present invention, the delay time can be controlled by changing connection of the delay control cell on the basis of a result of actual measurement after formation of the integrated circuit, whereby the number of times for re-designing the layout can be reduced and the term of works for fabricating the semiconductor device can be effectively reduced.

According to a sixth aspect of the present invention, the step of preparing the delay control cell includes a step of preparing a delay control cell having a switching interconnection line for switching connection of the delay control element in a wiring layer corresponding to an uppermost layer, and the step of changing connection of the delay control element on the basis of a measurement result of the internal clock includes a step of switching connection of the delay control element with the switching interconnection line.

In the method of fabricating a semiconductor device according to the sixth aspect of the present invention, connection of the delay control cell built in the integrated circuit can be changed by actually switching the switching interconnection line in formation of the integrated circuit, whereby an operation for changing a mask or the like can be omitted and the term of works for fabricating the semiconductor device can be effectively reduced.

According to a seventh aspect of the present invention, the step of preparing the delay control cell includes a step of preparing a delay control cell having a switching interconnection line which is arranged on a wiring track of a wiring layer corresponding to an uppermost layer.

In the method of fabricating a semiconductor device according to the seventh aspect of the present invention, the switching interconnection line is arranged on the wiring track, whereby increase of the layout area can be effectively suppressed in automatic placement and routing.

According to an eighth aspect of the present invention, the delay control cell which is prepared in the step of preparing the delay control cell having the switching interconnection line arranged on the wiring track of the wiring layer corresponding to an uppermost layer has a cell height which is equal to the interval of the wiring track.

In the method of fabricating a semiconductor device according to the eighth aspect of the present invention, the cell height corresponds to the interval of the wiring track, whereby wiring can be performed with no waste of the wiring track and increase of the layout area in automatic placement and routing can be effectively suppressed.

According to a ninth aspect of the present invention, the step of preparing the delay control cell includes a step of preparing a delay control cell having a switching interconnection line for switching connection of the delay control element in a wiring layer corresponding to an uppermost layer, and the step of creating the corrected layout diagram includes a step of changing connection of the delay control element with the switching interconnection line in response to a result of the circuit simulation.

In the method of fabricating a semiconductor device according to the ninth aspect of the present invention, connection of the delay control cell can be changed by switching the switching interconnection line due to change of the layout in the step of creating the layout diagram, whereby the number of times for re-designing the layout can be reduced and the term of works for fabricating the semiconductor device can be effectively reduced.

According to a tenth aspect of the present invention, the step of preparing the delay control cell having the switching interconnection line includes a step of preparing a delay control cell having a switching interconnection line which is arranged on a wiring track of a wiring layer corresponding to an uppermost layer.

In the method of fabricating a semiconductor device according to the tenth aspect of the present invention, the switching interconnection line is arranged on the wiring track, whereby increase of the layout area can be effectively suppressed in automatic placement and routing.

According to an eleventh aspect of the present invention, the delay control cell which is prepared in the step of preparing the delay control cell having the switching interconnection line arranged on the wiring track of the wiring layer corresponding to an uppermost layer has a cell height which is equal to the interval of the wiring track.

In the method of fabricating a semiconductor device according to the eleventh aspect of the present invention, the cell height corresponds to the interval of the wiring track, whereby wiring can be performed with no waste of the wiring track and increase of the layout area in automatic placement and routing can be effectively suppressed.

According to a twelfth aspect of the present invention, a semiconductor device comprises a substrate which is provided with a logic and a dynamic random access memory, a plurality of elements which are arranged on the substrate for forming the logic and the dynamic random access memory, a plurality of interconnection lines for connecting the plurality of elements with each other, and a plurality of wiring layers which are provided with the plurality of interconnection lines. The plurality of elements include a plurality of delay control elements having first and second electrodes with potentials of the first electrodes being fixed, the plurality of interconnection lines include a signal interconnection line for transmitting an internal clock which is used in the dynamic random access memory, and a plurality of first interconnection lines which are arranged on first virtual straight lines drawn at regular intervals on an uppermost layer among the plurality of wiring layers, and each of the plurality of delay control elements connects the second electrode to the signal interconnection line through one of the plurality of first interconnection lines.

In the semiconductor device according to the twelfth aspect of the present invention, a delay time in the signal interconnection line for transmitting the internal clock for the DRAM can be controlled by changing the connectional relation of the interconnection line on the uppermost layer and increase of the layout area can be suppressed by optimizing the arrangement relation between the logic, the DRAM, the signal interconnection line and the switching interconnection line in the uppermost layer, whereby delay of the internal clock of the semiconductor device can be effectively optimized while suppressing increase of the area resulting from provision of the delay control elements.

According to a thirteenth aspect of the present invention, the semiconductor device further comprises a pad which is connected to the signal interconnection line in the uppermost layer.

In the semiconductor device according to the thirteenth aspect of the present invention, the delay time for the internal clock transmitted through the signal interconnection line can be measured by applying a probe to the pad and the accuracy of control of the delay time is improved, whereby optimization of the delay of the internal clock of the semiconductor device is effectively simplified.

According to a fourteenth aspect of the present invention, the plurality of interconnection lines include a plurality of second interconnection lines which are arranged on second virtual straight lines drawn at regular intervals on a wiring layer existing under the uppermost layer, the second virtual straight lines are drawn at regular intervals, and the plurality of first interconnection lines have a length which is integral times the interval between the second virtual straight lines.

In the semiconductor device according to the fourteenth aspect of the present invention, increase of the layout area can be effectively suppressed by simplifying connection between the first interconnection line and the second interconnection line located under the uppermost layer.

According to a fifteenth aspect of the present invention, the semiconductor device further comprises a pad which is connected to the signal interconnection line in the uppermost layer.

In the semiconductor device according to the fifteenth aspect of the present invention, the delay time for the internal clock transmitted through the signal interconnection line can be measured by applying a probe to the pad and the accuracy of control of the delay time is improved, whereby optimization of the delay of the internal clock of the semiconductor device is effectively simplified.

Accordingly, an object of the present invention is to progress automatic placement and routing of a DRAM for reducing the term of works for fabrication. Another object of the present invention is to suppress increase of a layout area in automatic placement and routing.

The foregoing and other objects, features, aspects and advantages of the present invention will become more apparent from the following detailed description of the present invention when taken in conjunction with the accompanying drawings.

DESCRIPTION OF THE PREFERRED EMBODIMENT

Figure 1:
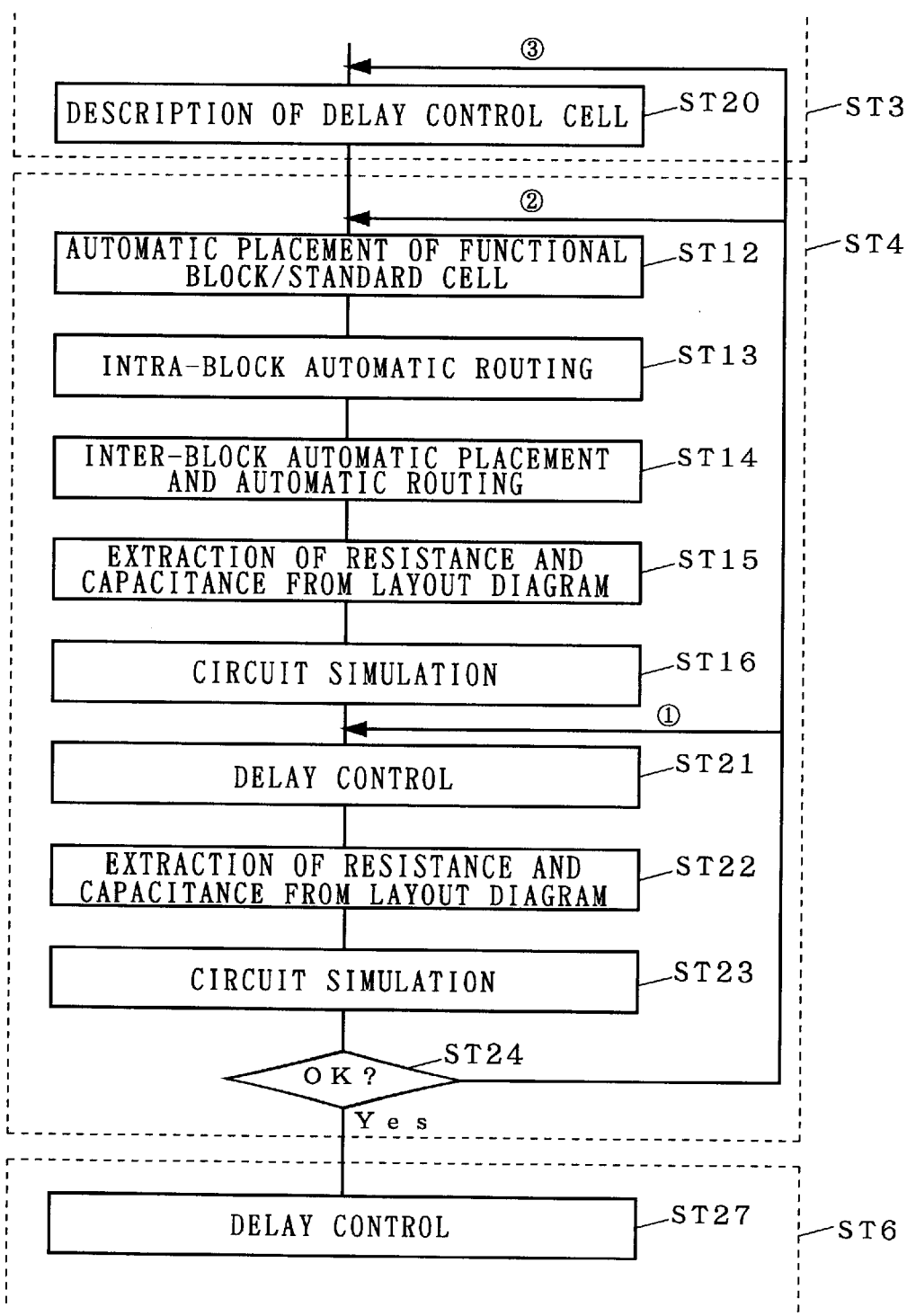
FIG. 1 is a flow chart showing a principal part of a method of fabricating a semiconductor device according to an embodiment of the present invention.

A method of fabricating a semiconductor device and a semiconductor device according to an embodiment of the present invention are now described. FIG. 1 is a flow chart showing a principal part of the method of fabricating a semiconductor device according to the embodiment of the present invention. The flow chart shown in FIG. 1 describes steps which are different from those of the background art and steps related thereto, while omitting the remaining steps which are identical to those of the background art.

A step ST20 of describing delay control cells is added to a step ST3 of logic design/circuit design. The delay control cells are capable of controlling a delay time by changing connection of delay control elements which are connected with interconnection lines. Each delay control cell has at least one switching interconnection line which is changeable with a computer in a design stage or with physical means such as an FIB (focused ion beam) in a wafer process. The delay time can be controlled by switching the switching interconnection line on data of the computer or on a product. The delay control elements include capacitors, for example, which can be connected with interconnection lines for changing capacitances of the interconnection lines and controlling the delay time for signals, for example.

Figure 2:
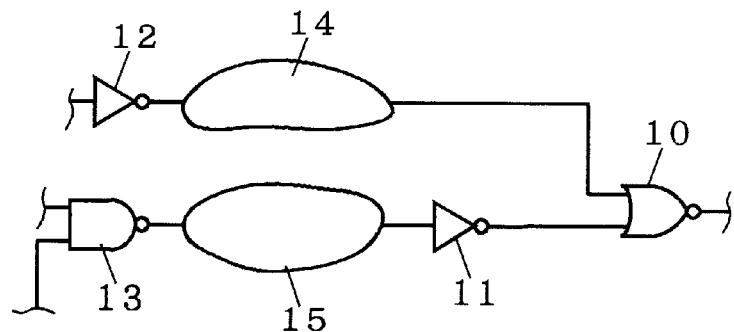
FIG. 2 is a logic circuit diagram for illustrating description of delay control cells.

FIG. 2 is a logic circuit diagram describing delay control cells 14 and 15. When a delay time for two input signals in a NOR gate 10 is so strictly limited that automatic placement and routing cannot be employed, for example, the delay control cells 14 and 15 are inserted in a front stage thereof. In this case, an output of a NOT gate 12 supplied to a first input of the NOR gate 10 through the delay control cell 14, while that of a NAND gate 13 is supplied to a second input of the NOR gate 10 through the delay control cell 15 and a NOT gate 11.

Layout design is performed at a step ST4 with circuit connection information describing the delay control cells. The fabrication method shown in FIG. 1 is different from that of the background technique in the layout design step ST4 in a point that delay control is enabled on the computer with the delay control cells after a circuit simulation step ST16. At a step ST21 therefor, a designer or the computer conirms the delay time and switches the switching interconnection lines of the delay control cells in response to the delay time for increasing the delay time if the same is too small with respect to specifications while reducing the delay time if the same is too large. When the output timing of the NOT gate 11 shown in FIG. 2 is quick, for example, the designer or the computer changes connection of the delay control elements to increase the delay time in the delay control cell 15.

Then, the designer or the computer extracts resistances and capacitances from a layout diagram again after the delay control (ST22), and performs circuit simulation (ST23). The designer or the computer determines whether or not desired delay timing is satisfied (ST24), and advances to a next step if the delay timing is satisfied. If the delay timing is not satisfied, on the other hand, the designer or the computer performs delay control again in a first stage. In a second stage, the designer or the computer repeats means for performing automatic placement and routing again under different conditions or the like until the desired delay timing is satisfied.

The delay time may be controlled at a test and evaluation step ST6. In this case, the switching interconnection lines must be arranged on positions of an uppermost layer among a plurality of wiring layers, for example, allowing disconnection/connection of interconnection lines with an FIB after completion of a wafer process. Alternatively, another method of controlling the delay time includes the case of replacing a mask and performing the wafer process again.

Parts allowing automatic placement and routing with the delay control cells are a DRAM control circuit and a test circuit in an eRAM, for example. The design of the eRAM is frequently changed and these circuits must be arranged/interconnection lined again every time the design is changed. Therefore, the term of works is remarkably reduced by automatizing the placement and routing of these parts. Further, the delay control cells can control signal delay after automatic placement and routing at the step S121, whereby the number of times for re-designing the layout can be reduced to attain reduction of the term of works.

Figure 3:
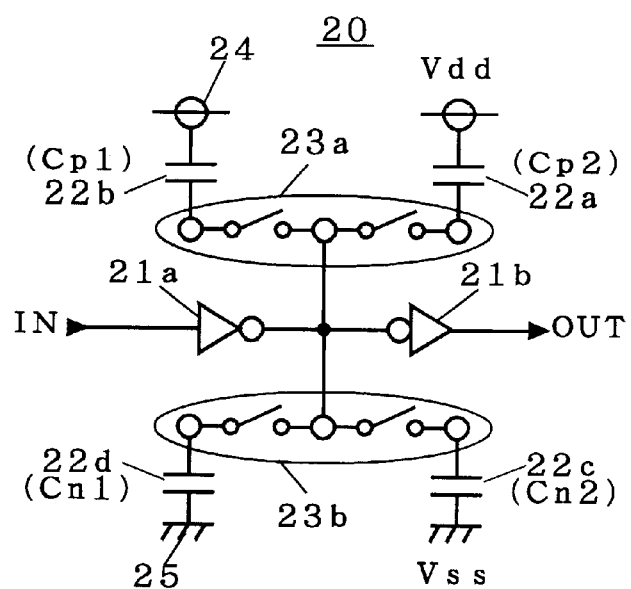
FIG. 3 is a circuit diagram showing an exemplary structure of a delay control cell.

FIG. 3 is a circuit diagram showing an exemplary structure of a delay control cell 20. The delay control cell 20 shown in FIG. 3 outputs a signal which is identical to a signal IN received in a NOT gate 21a from a NOT gate 21b after a prescribed delay time. A plurality of capacitors 22a to 22d are connected to a signal interconnection line which is provided between an output of the NOT gate 21a and an input of the NOT gate 21b. Switching interconnection line groups 23a and 23b can switch connection/disconnection between first electrodes of the plurality of capacitors 22a to 22d and the signal interconnection line provided between the NOT gates 21a and 21b. A power supply voltage Vdd is applied to second electrodes of the capacitors 22a and 22b, while a power supply voltage Vss is applied to second electrodes of the capacitors 22c and 22d. The NOT gates 21a and 21b can be replaced with other logic gates or transmission gates.

Figure 4:
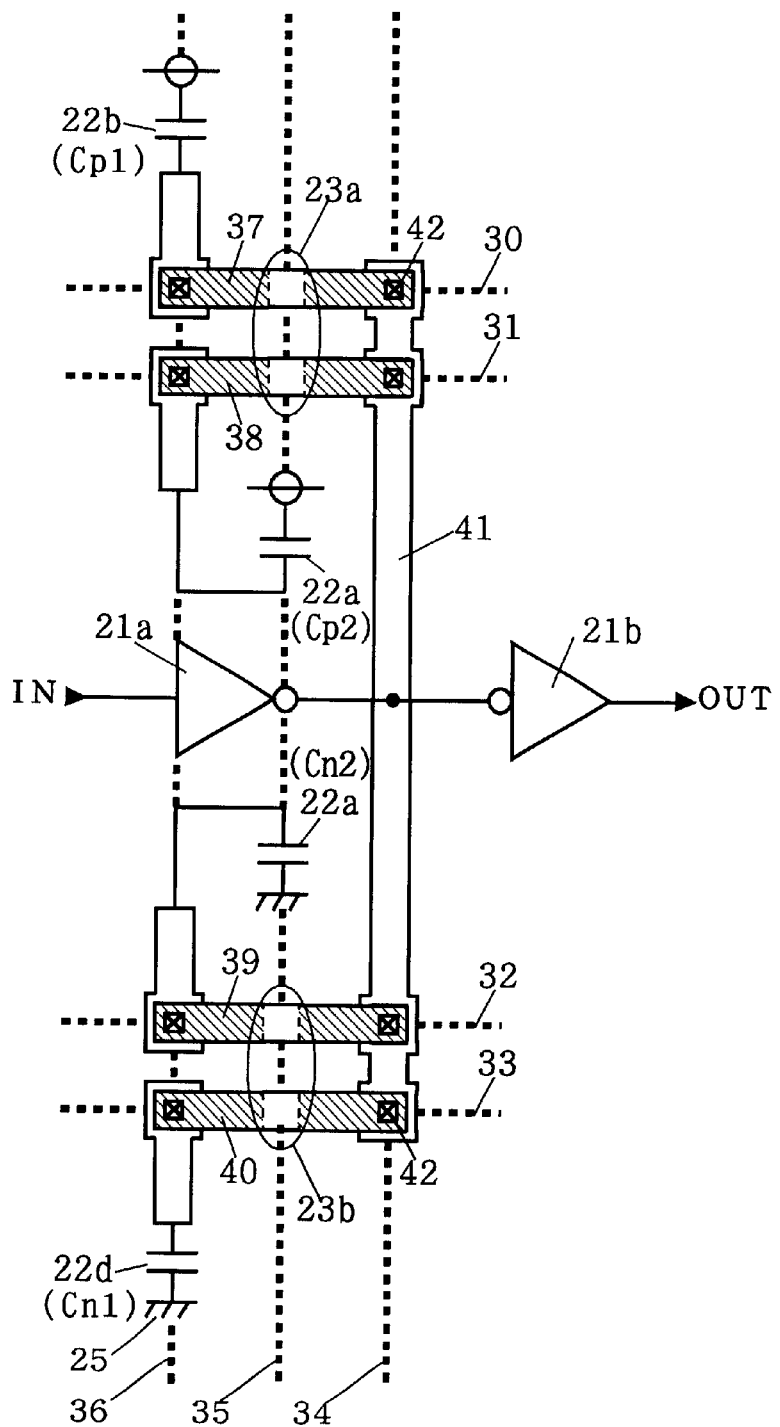
FIG. 4 is a layout diagram showing an exemplary layout related to the delay control cell shown in FIG. 3.

FIG. 4 is a layout diagram showing an exemplary layout of the delay control cell 20 shown in FIG. 3. Referring to FIG. 4, elements denoted by the same reference numerals as FIG. 3 correspond to those in FIG. 3. Dotted lines 30 to 33 show wiring tracks which are drawn on an uppermost layer among a plurality of wiring layers, and dotted lines 34 to 36 show wiring tracks which are drawn on a wiring layer next to the uppermost layer. I-shaped interconnection lines 37 to 40 are arranged on the tracks 30 to 33 respectively. These interconnection lines 37 to 40 are in a length corresponding to the distance between the tracks 34 and 36, i.e., a length which is integral times the interval between the tracks 34 to 36. First ends of the interconnection lines 37 to 40 are connected to the capacitors 22a to 22d. An interconnection line 41 which is arranged on the track 34 connects second ends of the interconnection lines 37 to 40 to the signal interconnection line provided between the NOT gates 21a and 21b. The interconnection line 41 is connected with the interconnection lines 37 to 40 through via contacts. The capacitors 22a to 22d can be connected to or disconnected from the signal interconnection line provided between the NOT gates 21a and 21b by disconnecting or connecting intermediate portions of the interconnection lines 37 to 40 with an FIB. Alternatively, it is possible to cope with switching of the switching interconnection line groups 23a and 23b by revising a mask of the uppermost layer. Arrangement of the switching interconnection line groups 23a and 23b on the uppermost layer is built in information of a cell library as the structure of the delay control cell 20.

Figure 5:
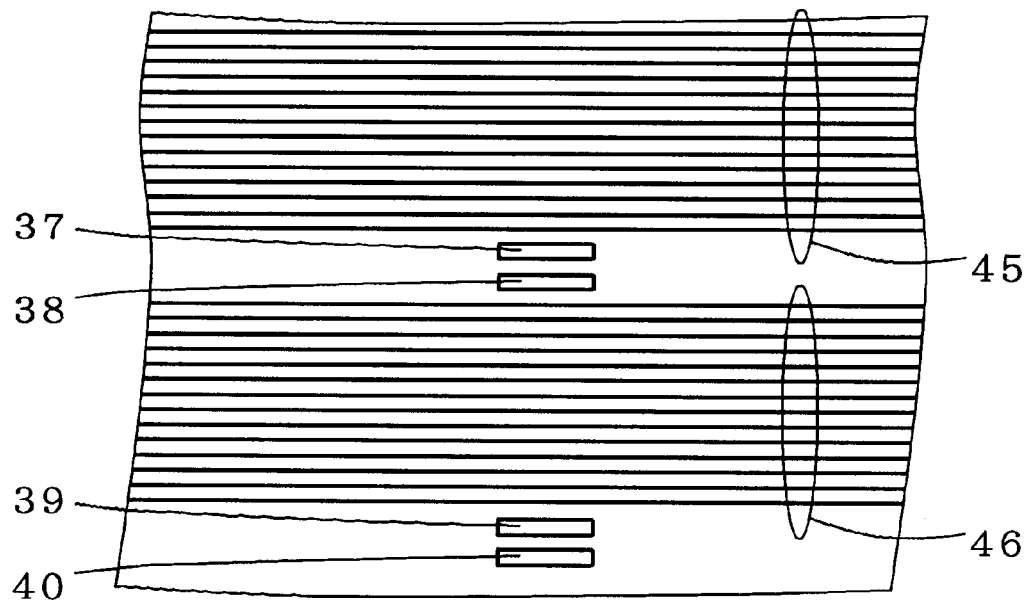
FIG. 5 is a plan view showing an exemplary wiring state of an uppermost layer on a DRAM control circuit or a test circuit.
Figure 23:
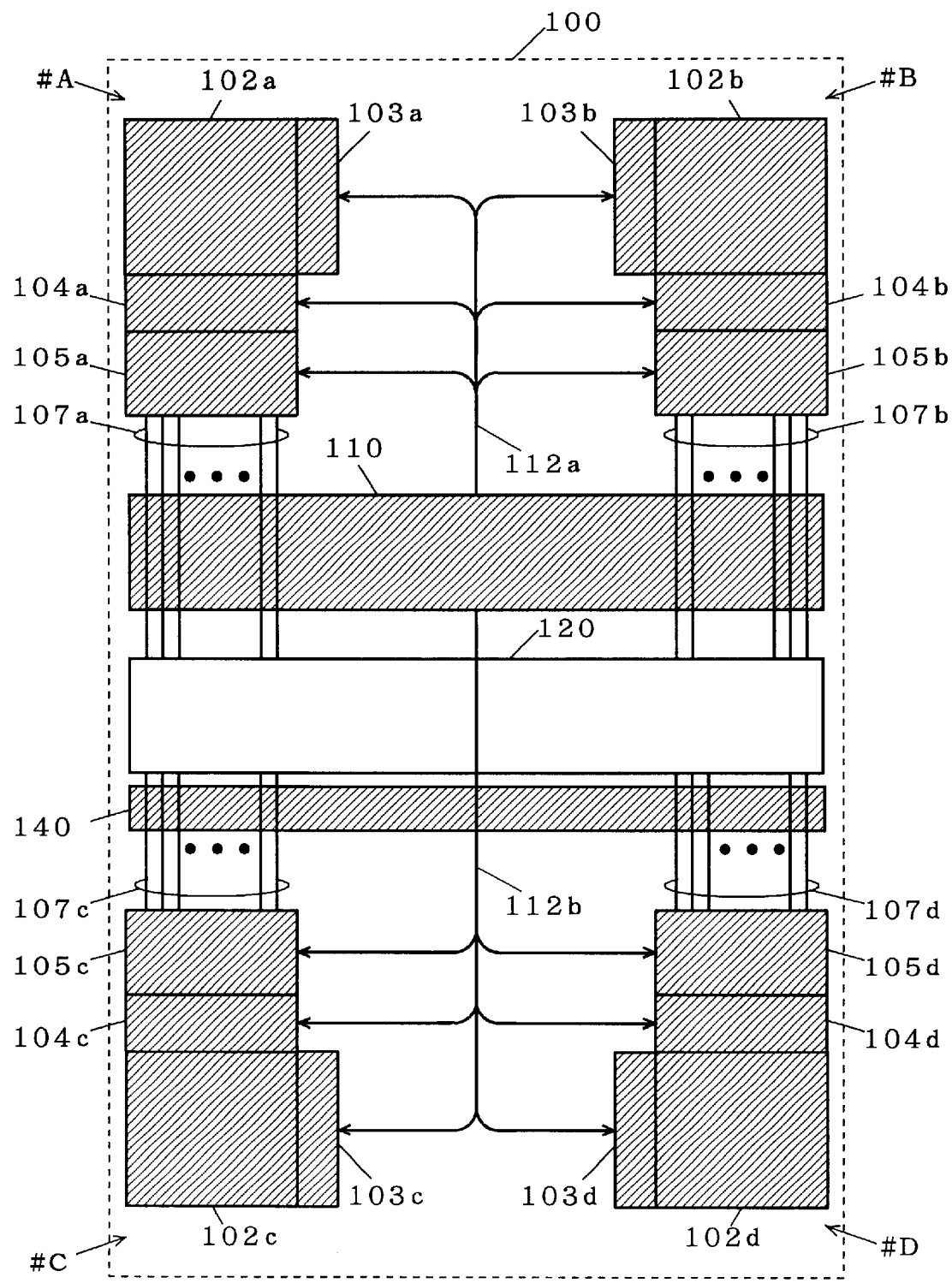
FIG. 23 is a block diagram showing an exemplary structure of an eRAM.
Figure 24:
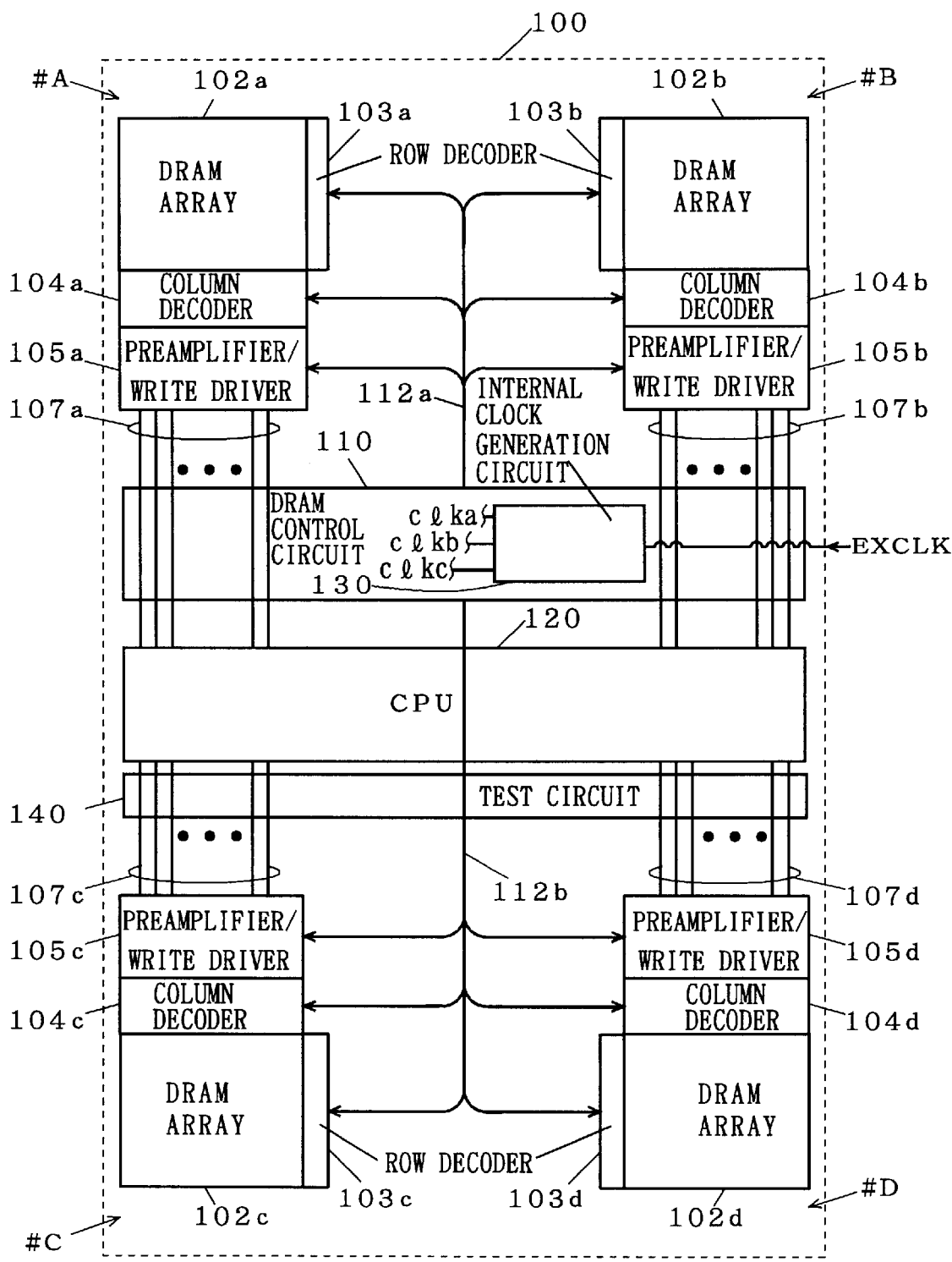
FIG. 24 is a block diagram for illustrating the structure of a DRAM control circuit.
Figure 25:
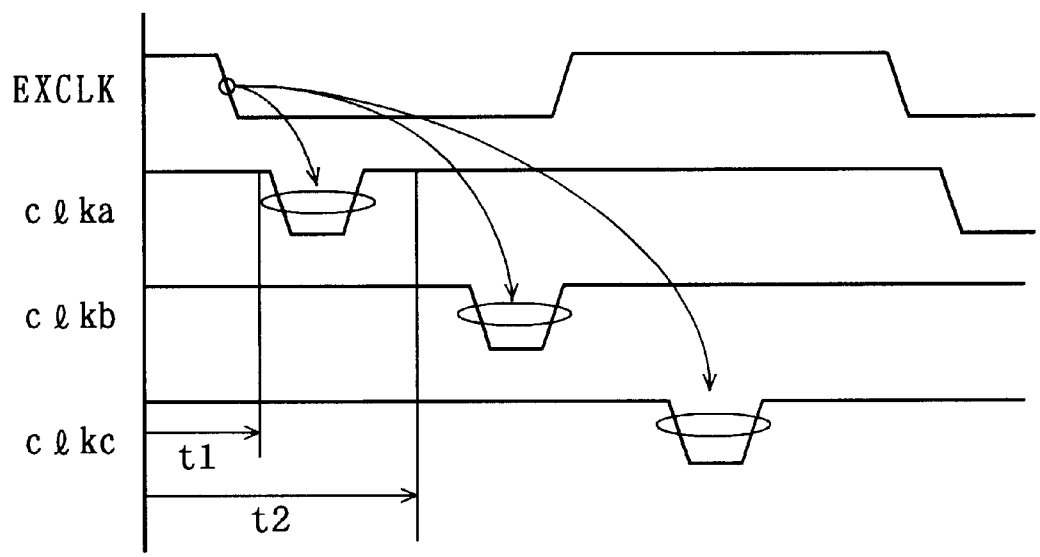
FIG. 25 is a timing chart showing exemplary internal clocks.

FIG. 5 is a plan view showing an exemplary state of interconnection lines on the uppermost layer of the DRAM control circuit 110 or the test circuit 140 shown in FIG. 24, for example. Referring to FIG. 5, interconnection line groups 45 and 46 correspond to a bus 107a etc. in FIG. 23, for example. These interconnection line groups 45 and 46 are also arranged on tracks drawn on the uppermost layer by automatic placement and routing, similarly to the tracks 30 to 33. If no switching interconnection lines 37 and 38 are arranged on the tracks, for example, the distance between the interconnection line groups 45 and 46 is increased to require an excess area, leading to reduction of the degree of integration. The areas required for the switching interconnection lines 37 to 40 can be reduced by arranging the same on the tracks in relation to parts automatically arranged/interconnection lined on the uppermost layer in other portions of the DRAM control circuit 110 or the test circuit 140. In relation to automatic placement and routing of parts other than the DRAM control circuit 110 and the test circuit 140 in the eRAM, further, the areas required for the switching interconnection lines 37 to 40 of the DRAM control circuit 110 or the test circuit 140 can be reduced by arranging the same on the tracks, thereby suppressing reduction of the degree of integration of the semiconductor device. When the switching interconnection lines 37 to 40 are formed by I-shaped ones, the layout area can be reduced as compared with the case of forming the same by L-shaped ones, for example.

Figure 6:
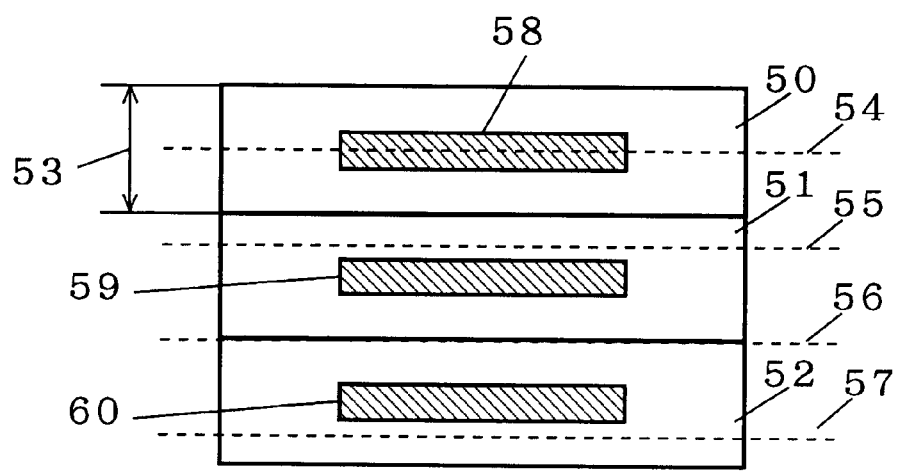
FIG. 6 is a conceptual diagram showing the relation between a cell height and interconnection lines on an uppermost layer in relation to delay control cells.

FIG. 6 is a conceptual diagram showing the relation between a cell height and interconnection lines on the uppermost layer. Cells 50 to 52 are laid. These cells 50 to 52 have the height shown by arrow 53 respectively. Numerals 54 to 57 denote wiring tracks. The cells 50 to 52 have regions 58 to 60 wirable on the uppermost layer respectively. If the height of the cells 50 to 52 is not integral times the distance between the tracks 54 to 57, the regions 58 to 60 wirable on the uppermost layer are displaced from the tracks 54 to 57 to result in unwirable tracks 55 to 57, leading to reduction of the degree of integration. Thus, switching interconnection lines or delay control cells can be densely arranged by setting the height of the delay control cells at integral times the distance between the tracks on the uppermost layer, thereby preventing reduction of the degree of integration.

Figure 7:
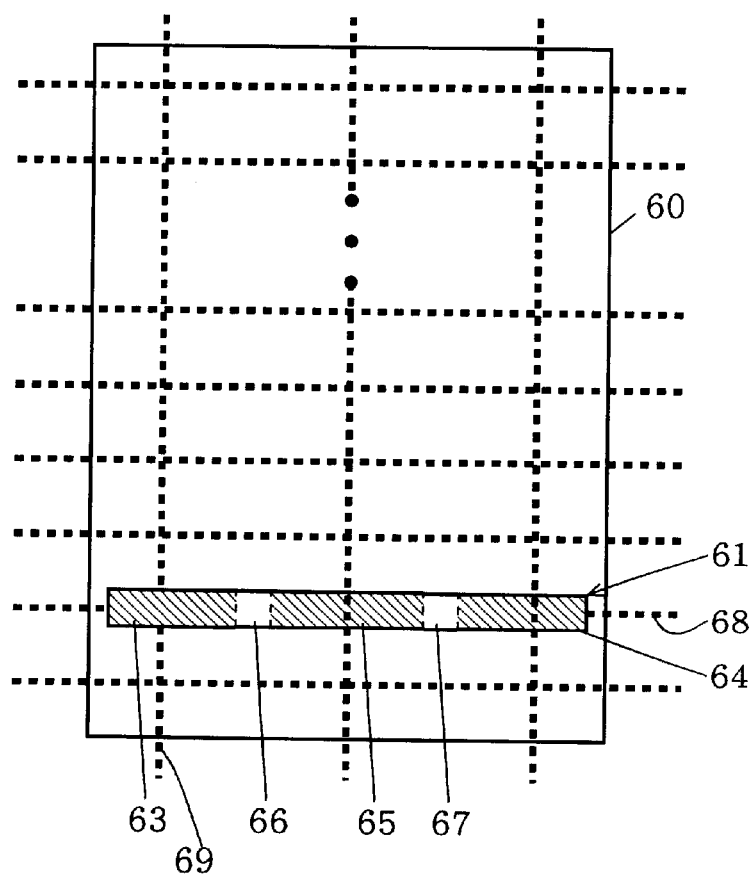
FIG. 7 is a layout diagram showing an exemplary layout of a switching interconnection line arranged on a delay control cell.
Figure 8:
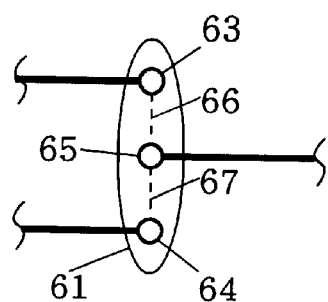
FIG. 8 is a circuit diagram for illustrating the concept of the switching interconnection line.

FIG. 7 is a conceptual diagram showing an exemplary layout of a switching interconnection line 61 arranged on a delay control cell 60. FIG. 8 is a circuit diagram showing the concept of the switching interconnection line 61. The switching interconnection line 61 of the delay control cell 60 comprises nodes 63, 64 and 65 and switching interconnection line parts 66 and 67 connecting the nodes 63 to 65 with each other. The switching interconnection line 61, which is arranged on a wiring track 68 of the uppermost layer with the nodes 63 to 65 arranged on a wiring track 69 next to the track 68, has a length which is integral times the interval between the tracks 68 and 69. Such an interconnection line exists with a physical width and a prescribed space is present between the same and an interconnection line provided on an adjacent wiring track. If the interconnection line is not formed to intersect with at least one wiring track provided on the layer next to the uppermost layer, therefore, efficiency of automatic placement and routing is reduced. The delay control cell 60 describes the aforementioned rule related to the switching interconnection line 61.

Figure 9:
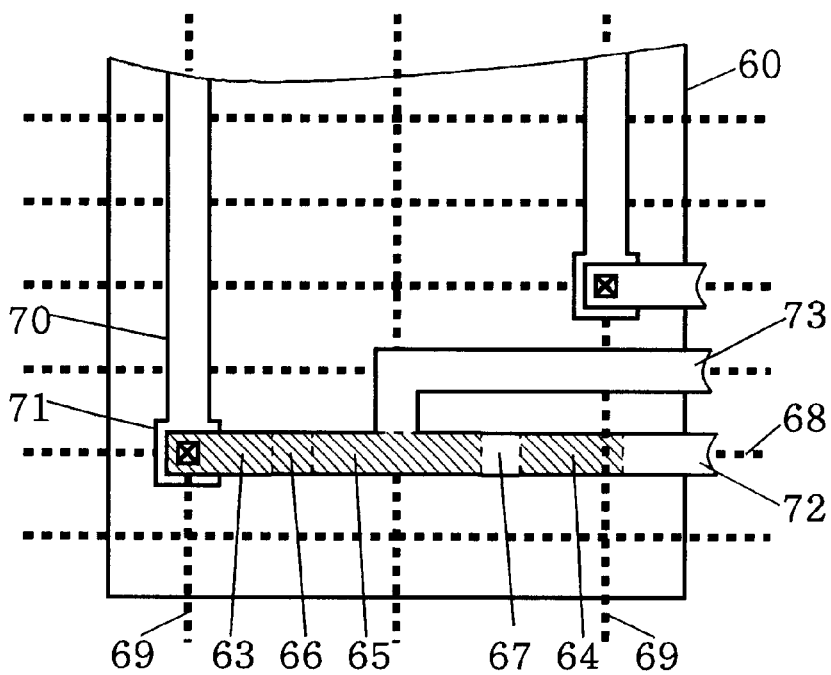
FIG. 9 is a layout diagram showing an exemplary wiring state of an uppermost layer and a layer next thereto upon completion of automatic placement and routing.
Figure 10:
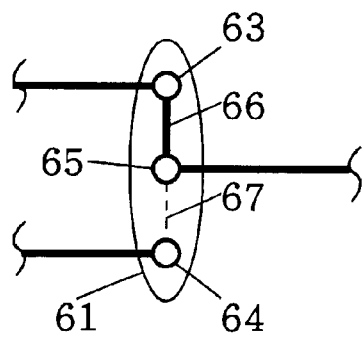
FIG. 10 is a conceptual diagram showing a state of a switching interconnection line shown in FIG. 9.
Figure 11:
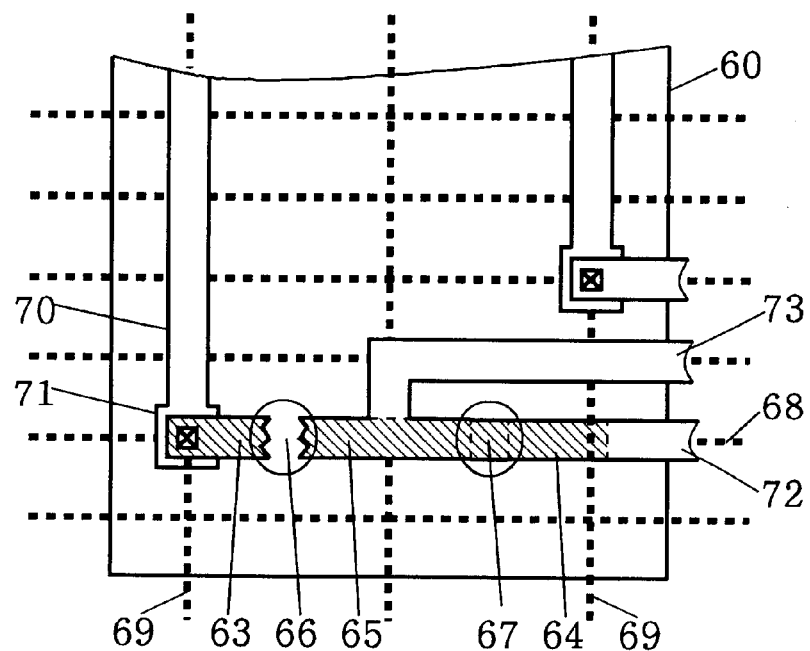
FIG. 11 is a layout diagram showing an exemplary wiring state of an uppermost layer and a layer next thereto upon completion of automatic placement and routing.
Figure 12:
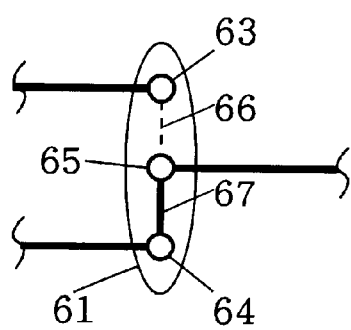
FIG. 12 is a conceptual diagram showing a state of a switching interconnection line shown in FIG. 11.

FIGS. 9 and 11 are layout diagrams showing exemplary wiring states of uppermost layers and layers next thereto upon completion of automatic placement and routing. FIGS. 10 and 12 are conceptual diagrams showing states of switching interconnection lines shown in FIGS. 9 and 11 respectively. An interconnection line 70 provided on the layer next to the uppermost layer is connected to a node 63 through a via contact 71. Interconnection lines 72 and 73 provided on the uppermost layer are connected to the node 63 and a node 65 respectively. While the nodes 63 and 65 are connected with each other in the state shown in FIG. 9, connection of a switching interconnection line 61 is switched to the state shown in FIG. 11 when a switch wiring part 66 is disconnected by an FIB and a switch wiring part 67 is connected by an FIB.

Figure 13:
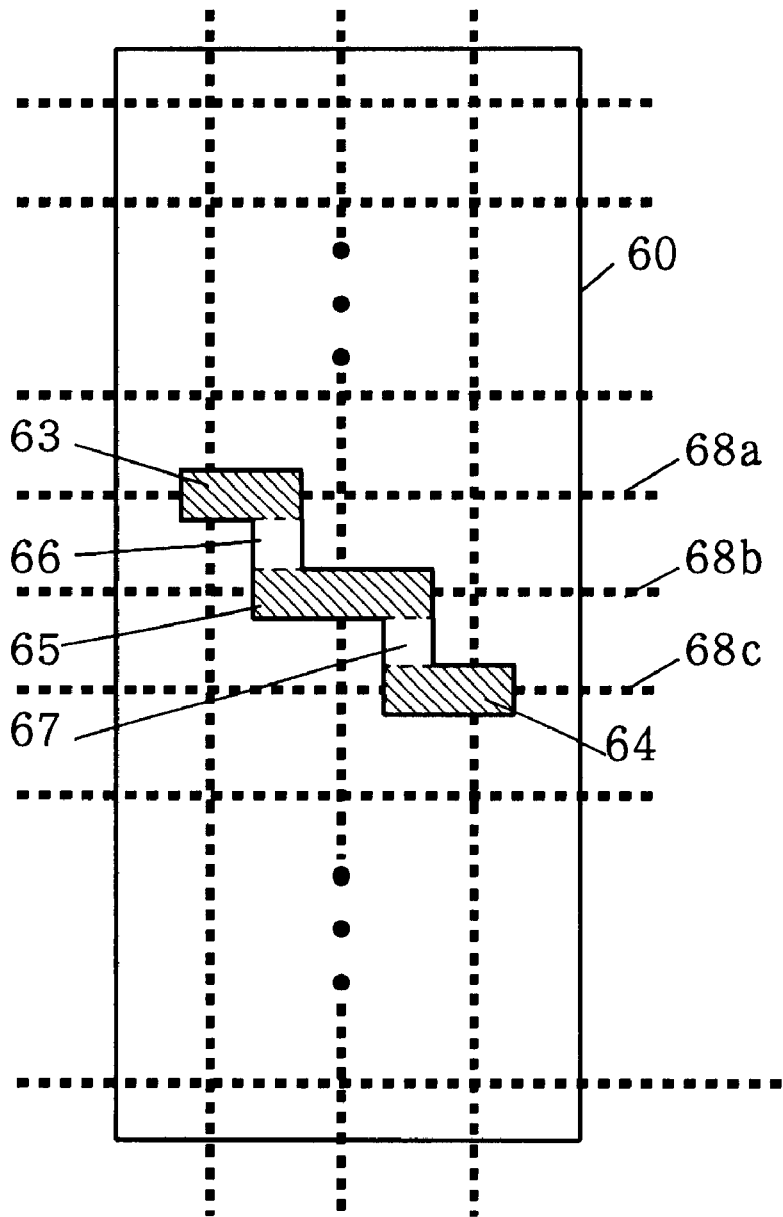
FIG. 13 is a layout diagram showing another exemplary layout of a switching interconnection line arranged on a delay control cell.

While the nodes 63 to 65 are formed on the single track 68 in FIG. 7, the same may alternatively be formed on a plurality of tracks 68a to 68c as shown in FIG. 13, to attain an effect similar to that in FIG. 7. In case of FIG. 13, switch wiring parts 66 and 67 are arranged between the tracks 68a and 68b and between the tracks 68b and 68c respectively.

Figure 14:
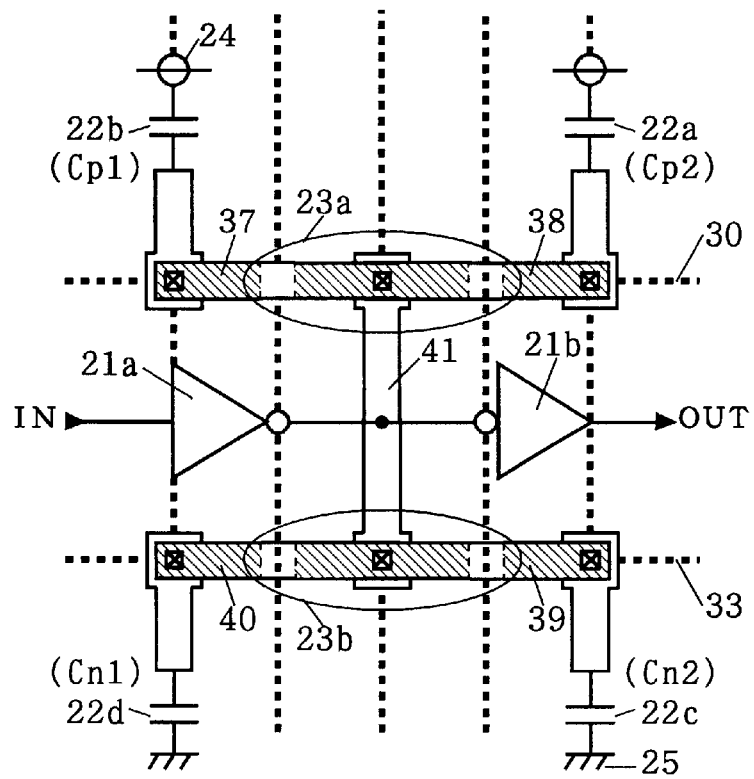
FIG. 14 is a layout diagram showing another exemplary layout related to the delay control cell shown in FIG. 3.

FIG. 14 is a layout diagram showing another exemplary layout of the delay control cell 20 shown in FIG. 3. The layout shown in FIG. 14 is different from that of FIG. 4 in a point that switching interconnection line groups 23a and 23b are formed on single tracks 30 and 33 respectively. In the structure shown in FIG. 14, the number of wiring tracks provided on the uppermost layer can be reduced as compared with the case of FIG. 4.

Figure 15:
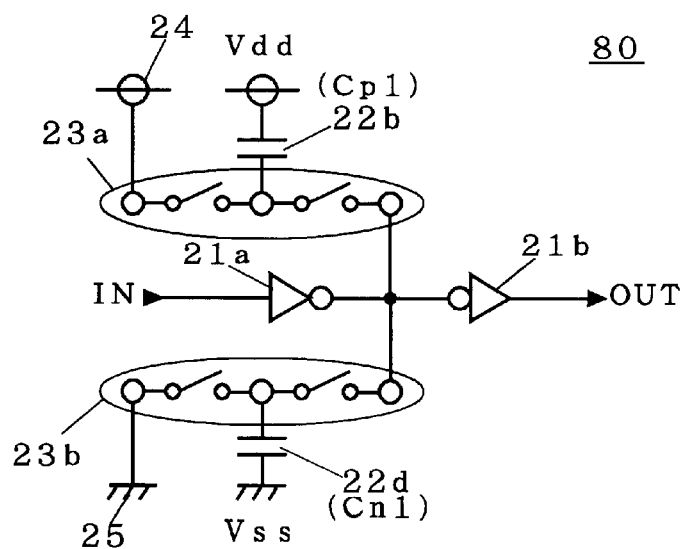
FIG. 15 is a circuit diagram for illustrating another exemplary structure of delay control cell.

Another structure of a delay control cell 80 is now described with reference to FIG. 15. The structure of the delay control cell 80 shown in FIG. 15 is different from that of the delay control cell 20 shown in FIG. 3 in a point that power supply voltages Vdd and Vss are applied across capacitors 22b and 22d respectively when the capacitors 22b and 22d are not connected to a signal interconnection line provided between NOT gates 21a and 21b. Therefore, switching interconnection line groups 23a and 23b are connected to power supply lines 24 for supplying the power supply voltages Vdd and Vss. If second electrodes of the capacitors 22b and 22d are not connected to the signal interconnection line provided between the NOT gates 21a and 21b, the power supply voltages Vdd and Vss are applied to these second electrodes. Thus, the second electrodes of the capacitors 22b and 22d can be prevented from entering floating states and causing electric inconvenience by fixing the voltages across the electrodes of the capacitors 22b and 22d.

Figure 16:
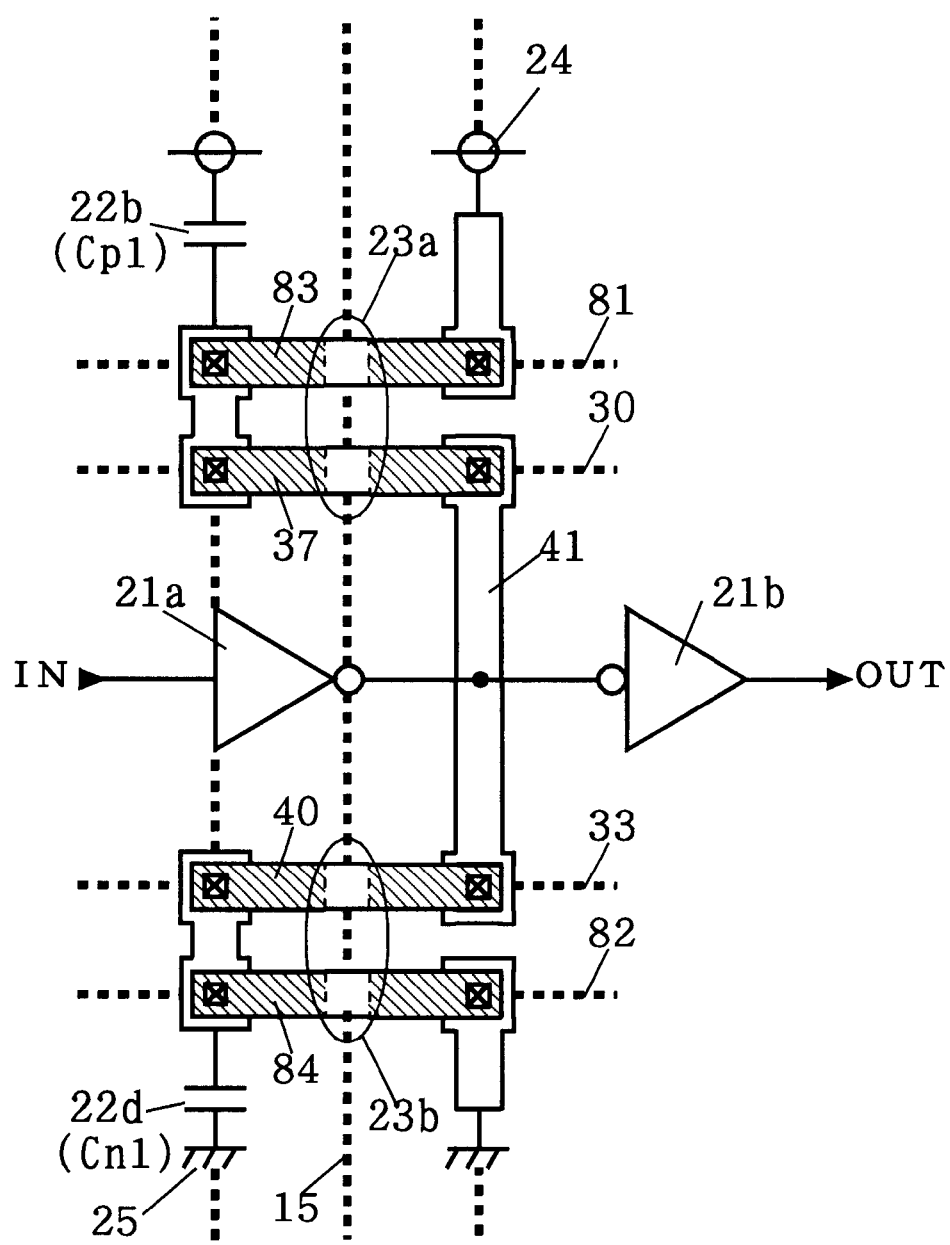
FIG. 16 is a layout diagram showing an exemplary layout related to the delay control cell shown in FIG. 15.

FIG. 16 is a layout diagram for illustrating an exemplary layout of the delay control cell 80 shown in FIG. 15. This figure shows interconnection lines provided on an uppermost layer and a layer next thereto. The layout shown in FIG. 16 is different from that of FIG. 4 in a point that the capacitors 22a and 22c are omitted and switching interconnection lines 83 and 84 are provided on nodes between second electrodes of capacitors 22b and 22d and switching interconnection lines 37 and 40 respectively. These switching interconnection lines 83 and 84 are connected to power supply interconnection lines 24 and 25 for supplying power supply voltages Vdd and Vss respectively. Each pair of the switching interconnection lines 37 and 83 and the switching interconnection lines 40 and 84 are so complementarily controlled that the first one is closed while the second one is open.

Figure 17:
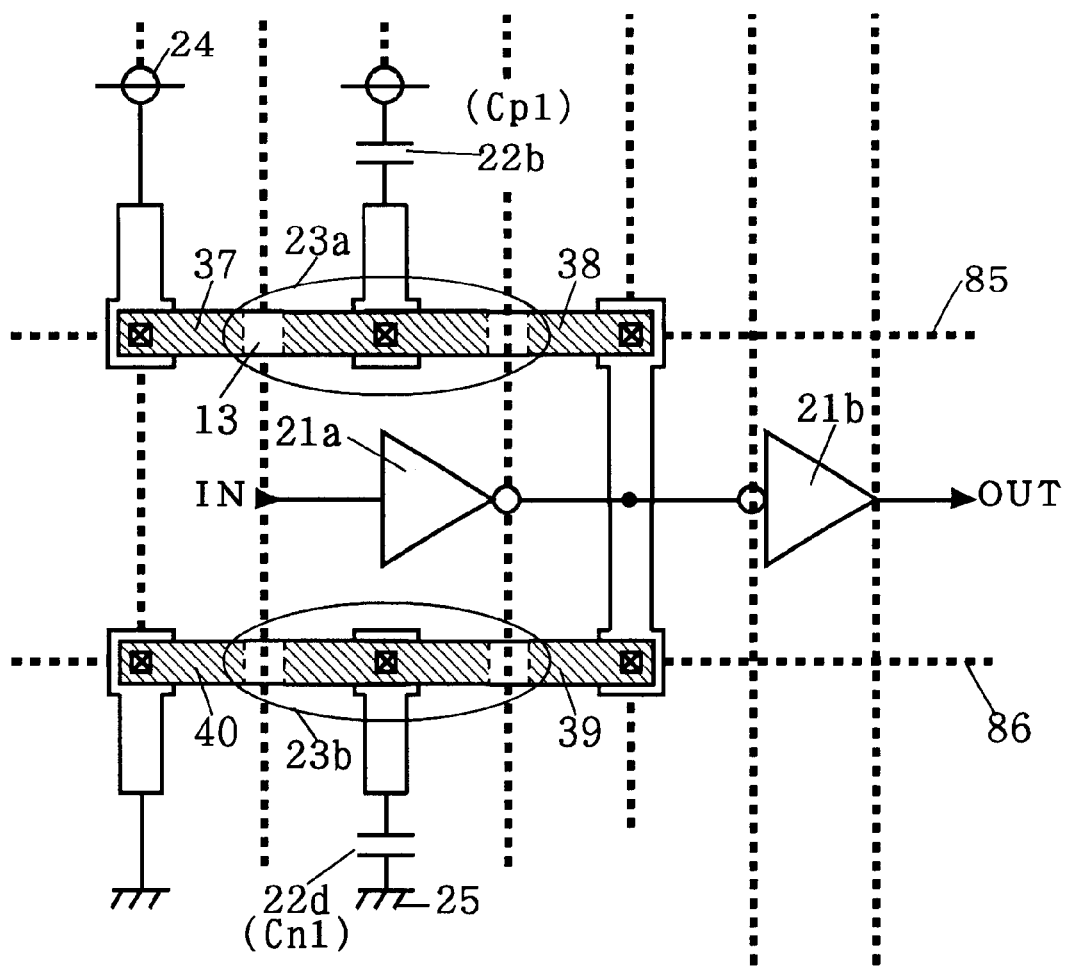
FIG. 17 is a layout diagram showing another exemplary layout related to the delay control cell shown in FIG. 15.

FIG. 17 is a layout diagram for illustrating another exemplary layout of the delay control cell 80 shown in FIG. 15. The layout shown in FIG. 17 is different from that of FIG. 16 in a point that switching interconnection line groups 23a and 23b are formed on single tracks 85 and 86 respectively. In the structure shown in FIG. 17, the number of wiring tracks provided on the uppermost layer can be reduced as compared with the case of FIG. 16.

Figure 18:
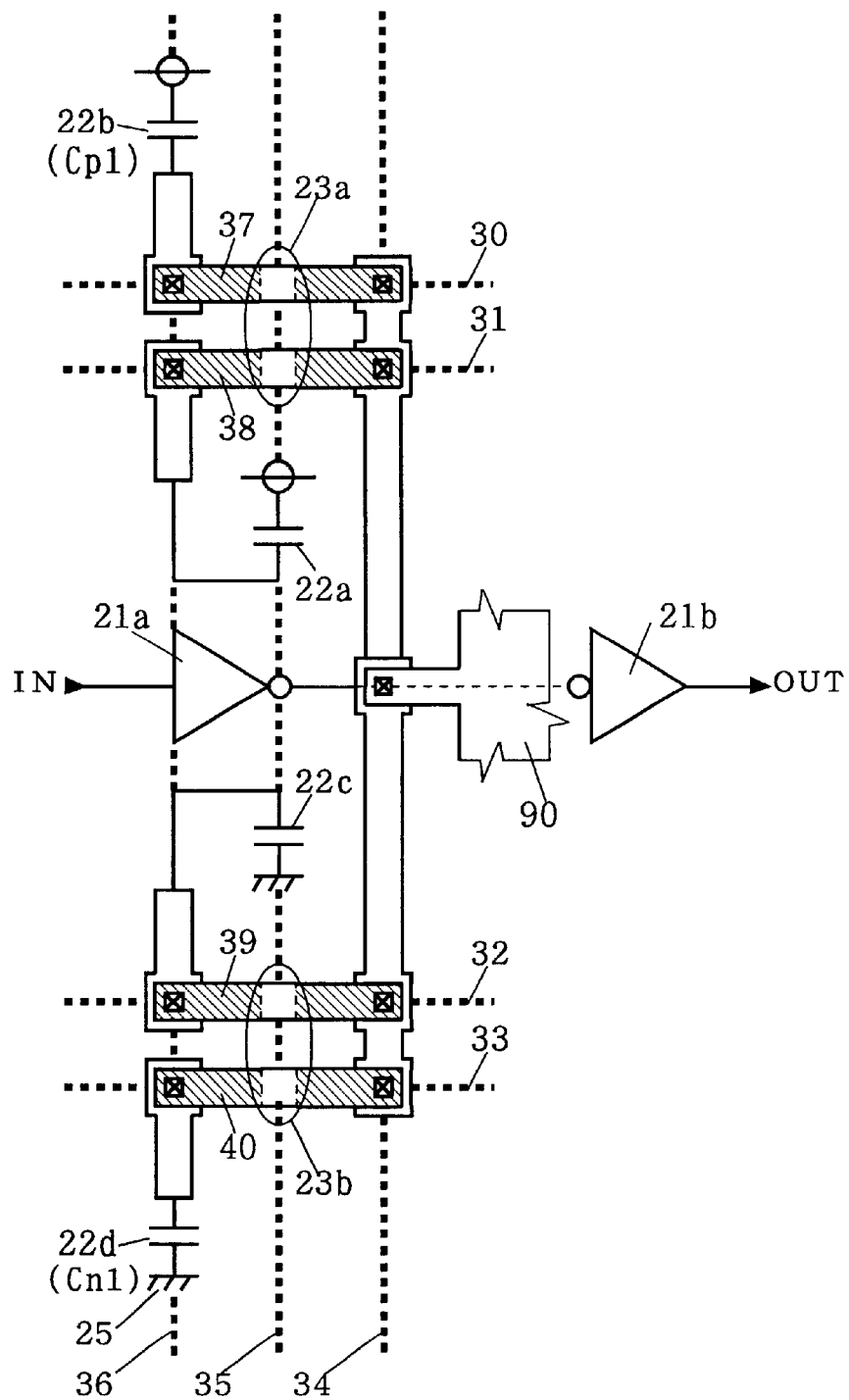
FIG. 18 is a layout diagram showing an exemplary layout of a delay control cell provided with a pad for measuring a delay time in an uppermost layer.
Figure 19:
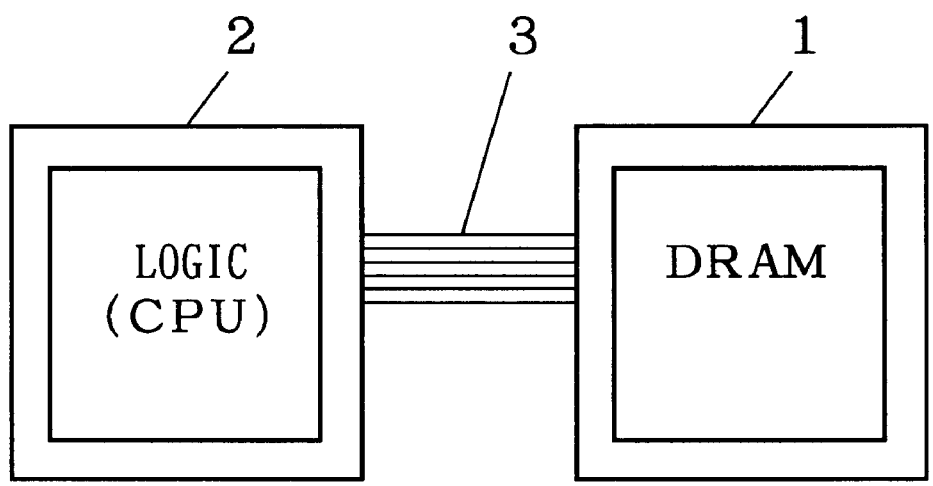
FIG. 19 is a conceptual diagram showing an exemplary structure of a semiconductor device comprising a DRAM and a logic formed on different chips.
Figure 20:
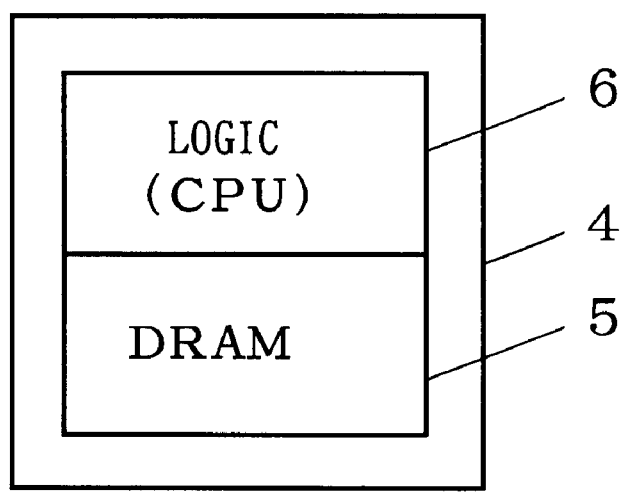
FIG. 20 is a conceptual diagram for illustrating the structure of an embedded RAM.
Figure 21:
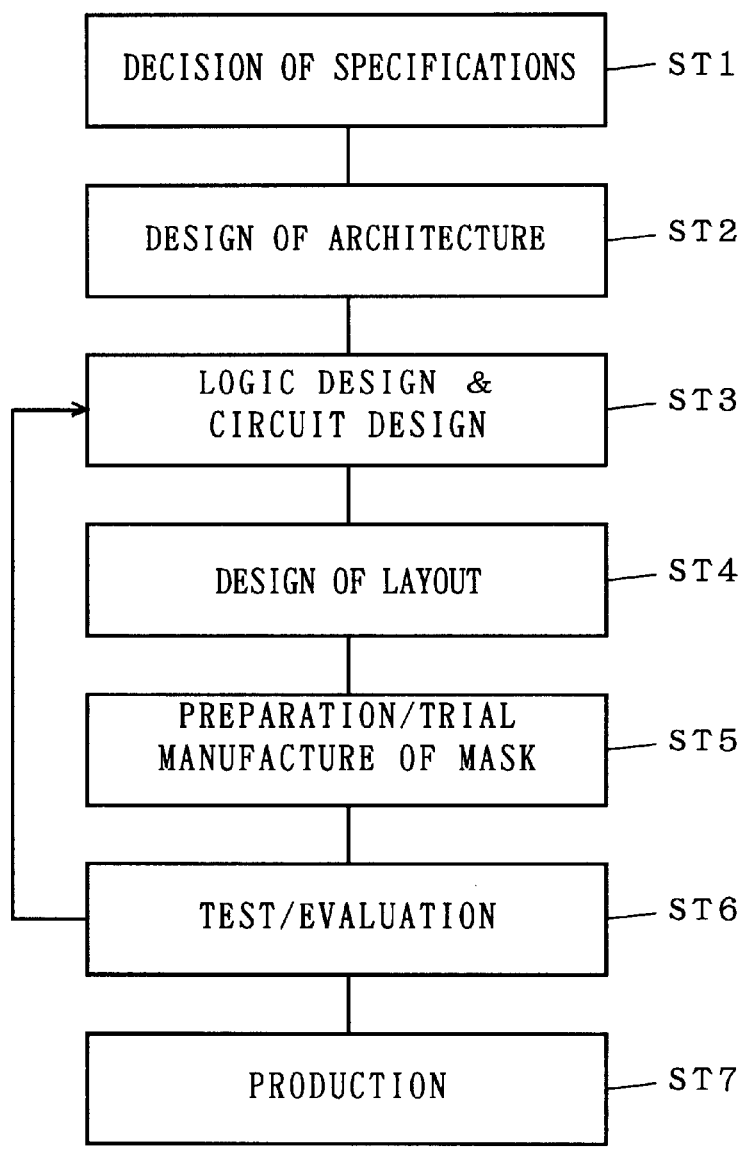
FIG. 21 is a flow chart showing an exemplary method of fabricating a semiconductor device of the background technique.
Figure 22:
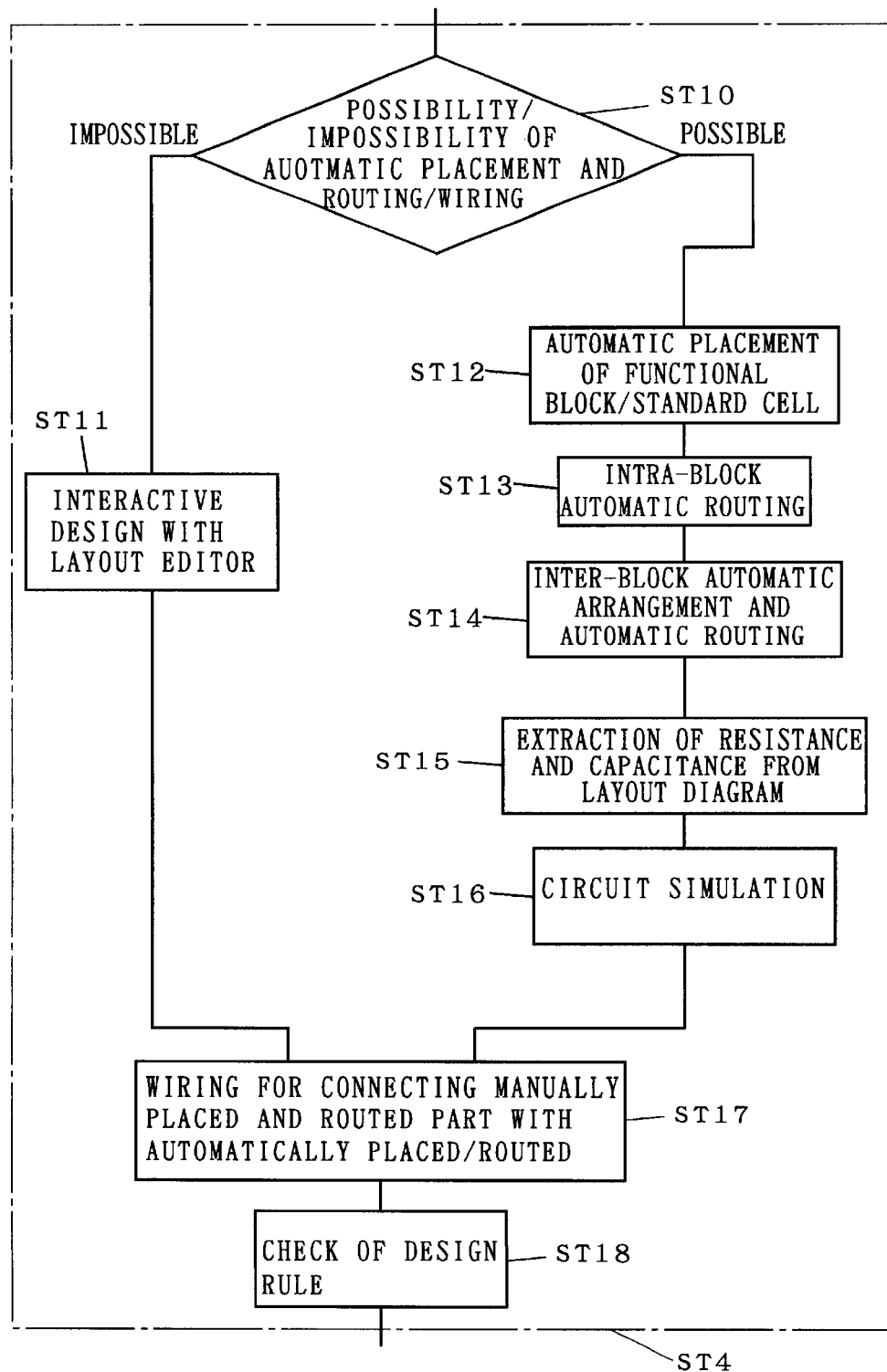
FIG. 22 is a flow chart as to exemplary layout design of the background technique.

A layout including a pad which is provided on an uppermost layer for measuring a delay time is now described with reference to FIG. 18. Referring to FIG. 18, numeral 90 denotes a pad which is brought into contact with a probe for measuring electric characteristics, while the same numerals as FIG. 4 denote parts corresponding to those in FIG. 4. Due to the formation of the pad 90 on the uppermost layer, the delay time can be measured after completion of a wafer process, so that switching interconnection lines 23a and 23b can be switched in response to a result of actual measurement of the delay time. Such a pad 90 can alternatively be provided on the other layout related to the delay control cell shown in FIG. 14, 16 or 17, for example. The probe is brought into contact with the pad 90 for measuring the delay time for internal clocks transmitted through a signal interconnection line, thereby improving accuracy of delay control and simplifying optimization of delay of the internal clocks in the semiconductor device.

While the invention has been shown and described in detail, the following description is in all aspects illustrative and restrictive. It is therefore understood that numerous modifications and variations can be devised without departing from the scope of the invention.

What is claimed is:

1. A method of designing a layout of a semiconductor integrated circuit, comprising the steps of:

preparing a delay control cell usable in automatic placement and routing;

describing said delay control cell in a circuit diagram, said delay control cell including a delay control element being connected to an internal line of the circuit diagram through a switching interconnection line, said switching interconnection line having a connection relation of the delay control cell to said internal line changeable before forming the integrated circuit on a semiconductor chip after describing said delay control cell; and;

creating a layout diagram from said logic circuit diagram by automatic placement and routing.

2. The method of manufacturing a layout of a semiconductor integrated circuit according to claim 1, wherein said step of creating said layout diagram includes the step of performing circuit simulation with a diagram after a description of said delay control cell; and obtaining a delay time of said internal line from a result of the circuit simulation; and determining whether to change connection relation of said switching interconnection line from said obtained delay time.

3. The method of designing a layout of a semniconductor integrated circuit according to claim 1, wherein
said switching interconnection line is laid out to arrange on an uppermost wiring layer of a semiconductor chip.

4. A method of fabricating a semiconductor device, comprising the steps of:
preparing a delay control cell usable in automatic placement and routing having a delay control element being connected by an interconnection line having connectional relation changeable before completion of a product;
describing said delay control cell in a logic circuit diagram related to a prescribed block of a dynamic random access memory, said prescribed block being concerned in an internal clock;
creating a layout diagram from said logic circuit diagram by automatic placement and routing; and
forming an integrated circuit on the basis of said layout diagram, wherein
said step of forming said integrated circuit, includes the steps of:
measuring said internal clock, and
changing connection of said delay control element on the basis of a measurement result of said internal clock.

5. The method of fabricating a semiconductor device in accordance with claim 4, wherein
said step of preparing said delay control cell includes a step of preparing a delay control cell having a switching interconnection line for switching connection of said delay control element in a wiring layer corresponding to an uppermost layer, and
said step of changing connection of said delay control element on the basis of a measurement result of said internal clock includes a step of switching connection of said delay control element with said switching interconnection line.

6. A method of fabricating a semiconductor device, comprising the steps of:
preparing a delay control cell usable in automatic placement and routing having a delay control element being connected by an interconnection line having connectional relation changeable before completion of a product;
describing said delay control cell in a logic circuit diagram related to a prescribed block of a dynamic random access memory, said prescribed block being concerned in an internal clock;
creating a layout diagram from said logic circuit diagram by automatic placement and routing; and
forming an integrated circuit on the basis of said layout diagram, wherein
said step of creating said layout diagram, includes the steps of:
extracting a resistance and a capacitance from an uncorrected layout diagram being formed by said automatic placement and routing,
performing circuit simulation with said uncorrected layout diagram and information of said resistance and said capacitance, and
changing connection of said delay control element in response to a result of said circuit simulation for creating a corrected layout diagram.

7. The method of fabricating a semiconductor device in accordance with claim 6, wherein
said step of forming said integrated circuit, includes the steps of:
measuring said internal clock, and
changing connection of said delay control element on the basis of a measurement result of said internal clock.

8. The method of fabricating a semiconductor device in accordance with claim 7, wherein
said step of preparing said delay control cell includes a step of preparing a delay control cell having a switching interconnection line for switching connection of said delay control element in a wiring layer corresponding to an uppermost layer, and
said step of changing connection of said delay control element on the basis of a measurement result of said internal clock includes a step of switching connection of said delay control element with said switching interconnection line.

9. The method of fabricating a semiconductor device in accordance with claim 8, wherein
said step of preparing said delay control cell includes a step of preparing a delay control cell having a switching interconnection line being arranged on a wiring track of a wiring layer corresponding to an uppermost layer.

10. The method of fabricating a semiconductor device in accordance with claim 9, wherein
said delay control cell being prepared in said step of preparing said delay control cell having said switching interconnection line being arranged on said wiring track of said wiring layer corresponding to an uppermost layer has a cell height being equal to the interval of said wiring track.

11. The method of fabricating a semiconductor device in accordance with claim 6, wherein
said step of preparing said delay control cell includes a step of preparing a delay control cell having a switching interconnection line for switching connection of said delay control element in a wiring layer corresponding to an uppermost layer, and
said step of creating said corrected layout diagram includes a step of changing connection of said delay control element with said switching interconnection line in response to a result of said circuit simulation.

12. The method of fabricating a semiconductor device in accordance with claim 11, wherein
said step of preparing said delay control cell having said switching interconnection line includes a step of preparing a delay control cell having a switching interconnection line being arranged on a wiring track of a wiring layer corresponding to an uppermost layer.

13. The method of fabricating a semiconductor device in accordance with claim 12, wherein
said delay control cell being prepared in said step of preparing said delay control cell having said switching interconnection line being arranged on said wiring track of said wiring layer corresponding to an uppermost layer has a cell height being equal to the interval of said wiring track.

14. A semiconductor device comprising:
a substrate being provided with a logic and a dynamic random access memory;
a plurality of elements being arranged on said substrate for forming said logic and said dynamic random access memory;
a plurality of interconnection lines for connecting said plurality of elements with each other; and a plurality of wiring layers being provided with said plurality of interconnection lines, wherein said plurality of elements include:

a plurality of delay control elements having first and second electrodes, with potentials of said first electrodes being fixed, said plurality of interconnection lines include:

a signal interconnection line for transmitting an internal clock being used in said dynamic random access memory, and a plurality of first interconnection lines being arranged on first virtual straight lines drawn at regular intervals on an uppermost layer among said plurality of wiring layers, and each of said plurality of delay control elements connects said second electrode to said signal interconnection line through one of said plurality of first interconnection lines.

15. The semiconductor device in accordance with claim 14, further comprising a pad being connected to said signal interconnection line in said uppermost layer.

16. The semiconductor device in accordance with claim 14, wherein said plurality of interconnecti on lines include:

a plurality of second interconnection lines being arranged on second virtual straight lines drawn at regular intervals on a wiring layer existing under said uppermost layer, said plurality of first interconnection lines have a length being integral integer times the interval between said second virtual straight lines.

17. The semiconductor device in accordance with claim 16, further comprising a pad being connected to said signal interconnection line in said uppermost layer.

* * * * *